United States Patent [19]

Visocchi

[11] Patent Number: 5,311,005
[45] Date of Patent: May 10, 1994

[54] OPTICAL TRANSMITTERS

[75] Inventor: Pasqualino M. Visocchi, Enfield, United Kingdom

[73] Assignee: Northern Telecom Limited, Montreal, Canada

[21] Appl. No.: 962,484

[22] Filed: Oct. 15, 1992

[30] Foreign Application Priority Data

Oct. 19, 1991 [GB] United Kingdom ............... 9122239

[51] Int. Cl.⁵ .................................................. G01J 1/32
[52] U.S. Cl. ..................................... 250/205; 359/187
[58] Field of Search ................. 250/205, 200; 455/613, 455/611; 372/31; 359/341, 187

[56] References Cited

U.S. PATENT DOCUMENTS 4,399,566  8/1983  Roullet et al. .................. 455/613
4,954,786  9/1990  Yamakawa et al. ............. 250/205

FOREIGN PATENT DOCUMENTS 2025121  1/1980  United Kingdom .

Primary Examiner—Davis L. Willis
Assistant Examiner—T. Davenport
Attorney, Agent, or Firm—Lee, Mann, Smith, McWilliams, Sweeney & Ohlson

[57] ABSTRACT

An optical transmitter including a laser diode (10) and achieving automatic slope variation compensation thereof. A photodetector (12) detects the output optical signal of the laser diode. One control loop (1) maintains the mean optical signal power output constant by adjusting the bias current Ib appropriately. Another control loop (2) adjusts the modulation current Imod to maintain the a.c. optical signal power constant. This is achieved by determining a voltage V2 corresponding to the mean a.c. optical signal power by rectification and comparison with a reference Vref2 to produce an error signal ΔV2. The a.c. optical signal power is thus used to indicate a reduction in slope efficiency.

8 Claims, 3 Drawing Sheets

OPTICAL TRANSMITTERS

BACKGROUND OF THE INVENTION

This invention relates to optical transmitters and in particular to laser diode slope compensation.

Slope variation of a laser diode is the variation in output optical power with drive current, above threshold, which occurs with variations in temperature and over time. For optical fibre transmission, a slope variation compensation circuit must be used in order to maintain a constant extinction ratio of the transmitted optical signal.

Slope variation compensation may be achieved by superimposing a low frequency ripple onto the optical carrier to "measure" the slope variation of optical output versus drive current (within the lasing mode). The ripple is detected by a back facet monitor photodiode, which may be configured within a feedback, feedforward, or a combination of feedback and feedforward, arrangement to compensate for slope variation. The disadvantage of this method is that it depends on the linearity of laser light against drive current slope at the high current part of the slope, where non-linearity are most likely to occur. Another approach is to peak detect the digital optical signal from the back facet monitor photodiode and compare the digital "1" and "0" with their respective reference voltages.

SUMMARY OF THE PRESENT INVENTION

According to the present invention there is provided an optical transmitter including a laser diode and achieving automatic slope variation compensation of the laser diode, the transmitter further including a photodetector disposed to detect the output optical signal of the laser diode, a first control loop and a second control loop, the first control loop serving to maintain the mean optical signal power output from the laser diode at a first predetermined level by adjustment of the bias current applied thereto, in response to comparison of a voltage signal representing mean optical signal power obtained from the photodetector a.c. output signal with a voltage corresponding to the first predetermined level, and the second control loop serving to adjust the modulation current applied to the laser diode whereby to maintain the a.c. optical signal power output from the laser diode at a second predetermined level, which modulation current adjustment is carried out in response to the detection of an error signal between the second predetermined level and a mean value of the a.c. optical signal power obtained in the second control loop from the photodetector a.c. output signal by successive amplification and rectification.

BRIEF DESCRIPTION OF THE DRAWINGS

Embodiments of the invention will now be described with reference to the accompanying drawings, in which.

DESCRIPTION OF THE PREFERRED EMBODIMENTS

Figure 1:
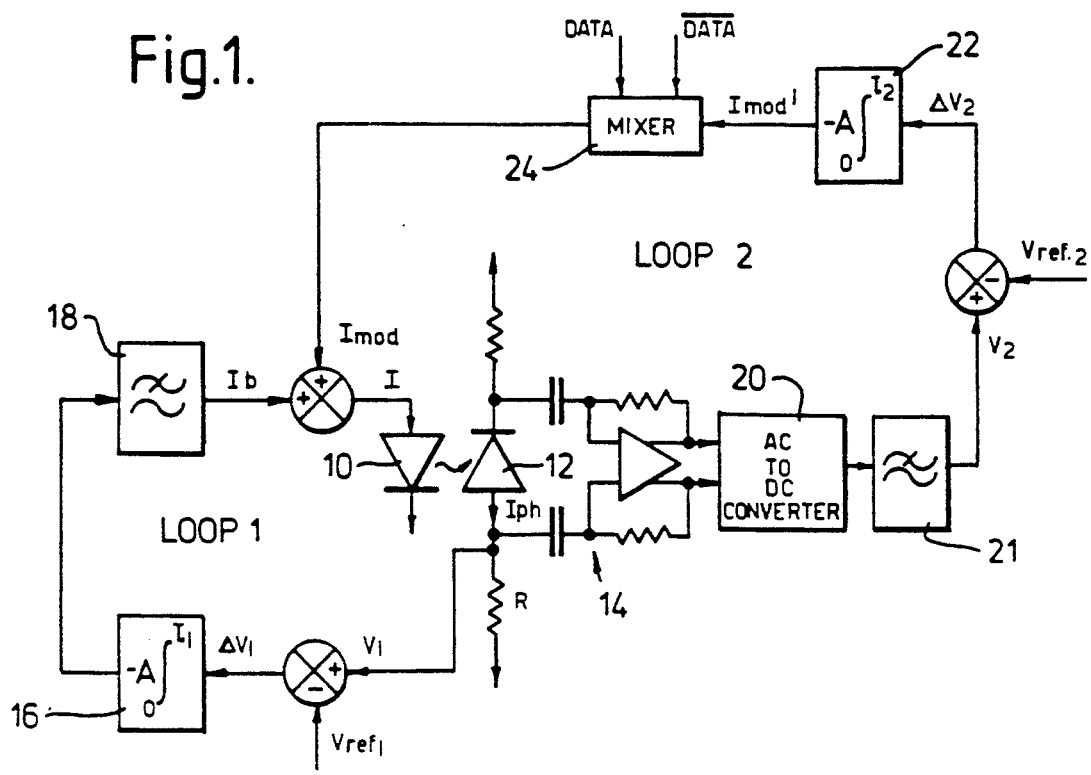
FIG. 1 illustrates a first embodiment in block diagram form.

Referring firstly to FIG. 1, laser diode 10 requires to have its slope compensated for variations occurring with temperature or time. The total current flowing through laser diode 10 is I. This is the sum of the bias current Ib (normally at the threshold current It) and an a.c. modulation current Imod which itself switches between Ib and the current corresponding to peak optical power Ppeak.

The output signal of a back facet monitor photodiode 12 is used to control both the bias current (via loop 1) and the modulation current (via loop 2) applied to laser diode 10, in order to maintain a constant mean power Pmean and extinction ratio. Control loop 1 is used to maintain a constant mean power by adjusting the bias current Ib of the laser diode 10. If the modulation control loop 2 is operating correctly, the bias current will be equal to the threshold current It of the laser diode.

The output signal Iph from the back facet monitor photodiode 12 under normal modulation is an a.c. signal representing the output power of the laser diode 10. The a.c. signal of Iph is shunted to an a.c. ground via a transimpedence amplifier 14. Terminating resister R of amplifier 14 generates a d.c. voltage signal V1 representing the mean optical power output Pmean. Voltage signal V1 is compared with a reference voltage Vref 1 which determines the laser diode's mean optical power. The resultant error signal $\Delta V1$, if any, is applied to a high gain transconductance amplifier 16 with a large integration time ($\tau 1$ of the order of seconds) in order to prevent the bias current Ib changing due to patterning effects. The bias current Ib is applied to the laser diode 10 via a post filtering circuit 18.

The a.c. signal Iph from the back facet monitor photodiode 12, as mentioned above, is applied to transimpedence amplifier 14 which is configured differentially to minimise "common mode" signals within the overall laser diode package. The differential output of amplifier 14 is applied to a high speed AC to DC converter 20 (rectifier) from which the rectified signal output is integrated and filtered at 21 to provide a voltage output V2 representing the mean a.c. optical power. The voltage V2 is compared with a reference voltage Vref2 which determines the "mean" a.c. optical power of the laser diode. The resultant error signal $\Delta V2$, which may have fluctuations due to patterning effects, is applied to a high gain transconductive amplifier 22 with a large integration time ($\tau 2$ of the order of seconds) to prevent modulation current changes due to the patterning effects. The resultant d.c. modulation current Imod' is applied to a mixer circuit 24 with the application of a DATA and/or $\overline{DATA}$ signal, the resultant output a.c. modulation current Imod being applied to the laser diode 10.

Figure 2:
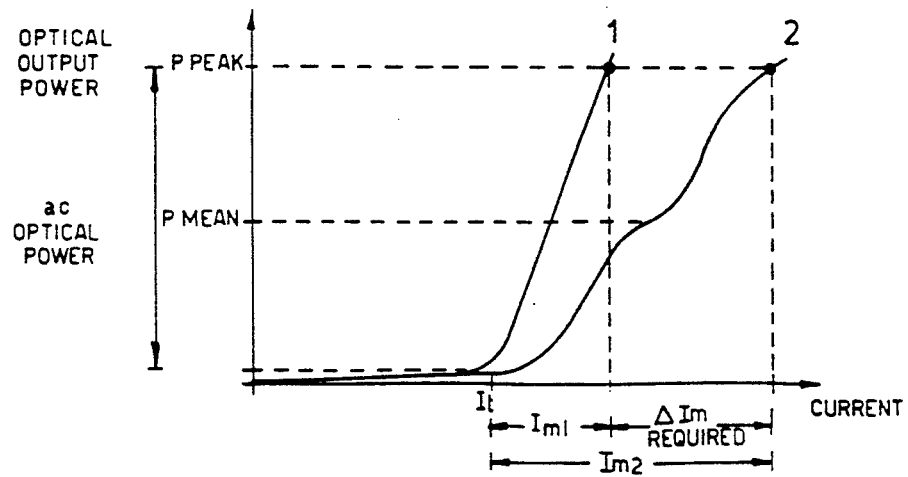
FIG. 2 illustrates two cases of variation in optical output power with drive current.

The laser diode's characteristic may change with time and/or temperature, in particular the laser diode slope efficiency (i.e. the output optical power versus drive current above threshold) or its linearity, as illustrated in FIG. 2.

Initially the laser diode mean optical power Pmean and the modulation current Imod are set, using Vref1 and Vref2 alone, to conform to characteristic 1 which exhibits the correct extinction ratio. If subsequently the characteristic changes to slope efficiency characteristic 2, requiring an increase in modulation current from IM1 to IM2, the mean power control loop 1 will attempt to maintain a constant output power, resulting in the bias current increasing above threshold. This causes the a.c. optical power to fall, which in turn decreases the "a.c. power" voltage V2 from the rectifier output, resulting in an increase in the error signal ΔV2. Thus the modulation current Imod applied to the laser diode must increase to the required amount to reduce the error signal and thus maintain the correct a.c. optical signal power.

If the laser diode characteristic exhibits small amounts of non-linearities, the a.c. power control loop 2 integrates the total laser diode slope from threshold to peak power, giving a linear approximation for the modulation current. This may cause a small penalty in the extinction ratio. In both loops the time constants are required to be long relative to the data, there being an optimum time difference between the two time constants for optimum operation.

Compensation of the slope variation of a laser diode due to temperature and/or time is thus achieved without the use of low frequency ripple or peak detection, rather the a.c. and mean optical powers are compared in order to obtain the optimum optical extinction ratio. The a.c. optical signal power is used to indicate a reduction in slope efficiency.

The description above refers to laser diodes for use in optical fibre transmission systems. There is, however, growing interest in optical microwave subcarrier communications and transmitters therefore, which would also employ laser diodes and require slope variation compensation. The arrangement described above with reference to FIG. 1 is not suitable for such microwave applications without modification. This is due to the limited bandwidth of the back facet photodiode 12 and the problem is enhanced as the bit rate increases. If the overall optical transmitter were to be employed as an analogue transmitter where a small microwave signal was modulated on the linear portion of the laser diode characteristic, a conventional back facet photodiode would not be usable.

Figure 3:
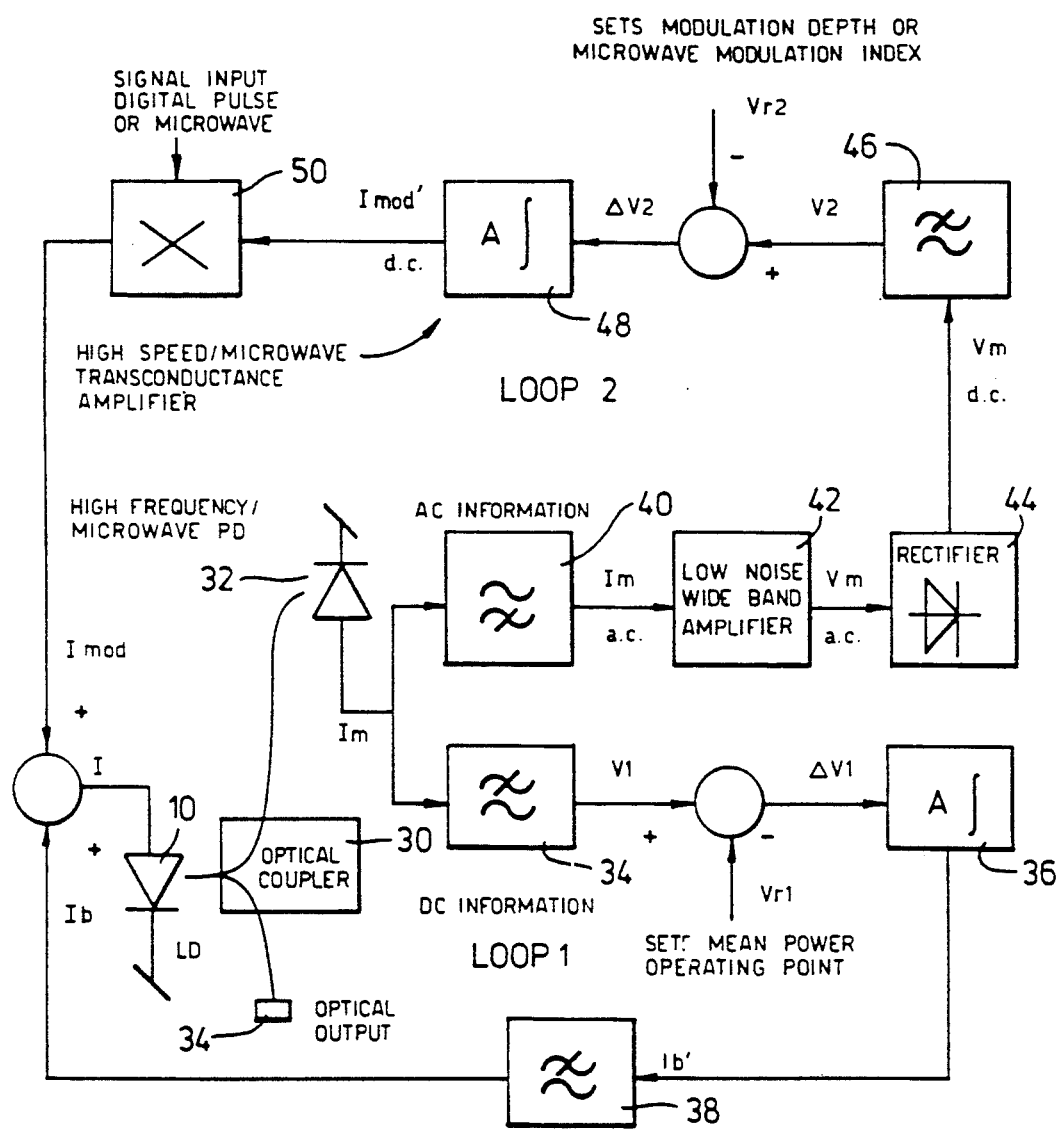
FIG. 3 illustrates a second embodiment in block diagram form.

However, a fibre optical coupler 30 can be arranged at the laser diode output as indicated in FIG. 3 so as to split off a small proportion of the output signal and apply it to a very high frequency microwave PIN photodiode 32, for example a 30 GHz device, and the slope may be very accurately compensated as a result. The remainder of the laser diode optical output is available from the coupler 30 at output 34. The output of PIN photodiode 32 is applied to two loops as before. The d.c. information is applied to loop 1 including a low pass filter 34 and compared with a reference voltage Vr1 used to set the d.c. (mean power) operating point. The resultant error signal ΔV1 is applied to a transconductance amplifier 36 to produce bias current Ib' which is low pass filtered at 38 and the resultant bias current Ib applied to the laser diode 10.

The a.c. information in the PIN photodiode output signal is high passed filtered at 40 to produce an a.c. modulation current Im which is applied to a low noise wide band amplifier 42, the resultant a.c. modulation voltage Vm is rectified at 44, producing a d.c. modulation voltage Vm, which is low pass filtered at 46 to produce voltage V2, which is compared with the reference voltage Vr2, which is used to set the microwave modulation index (modulation depth in the case of digital pulses). The resultant error signal ΔV2 is applied to the high speed microwave transconductive amplifier 48 which produces d.c. modulation current Imod'. The latter is applied to mixer circuit 50 together with the signal input (digital pulse or microwave) and the resultant output modulation current Imod is applied to the laser diode 10 together with the bias current Ib.

Figure 4:
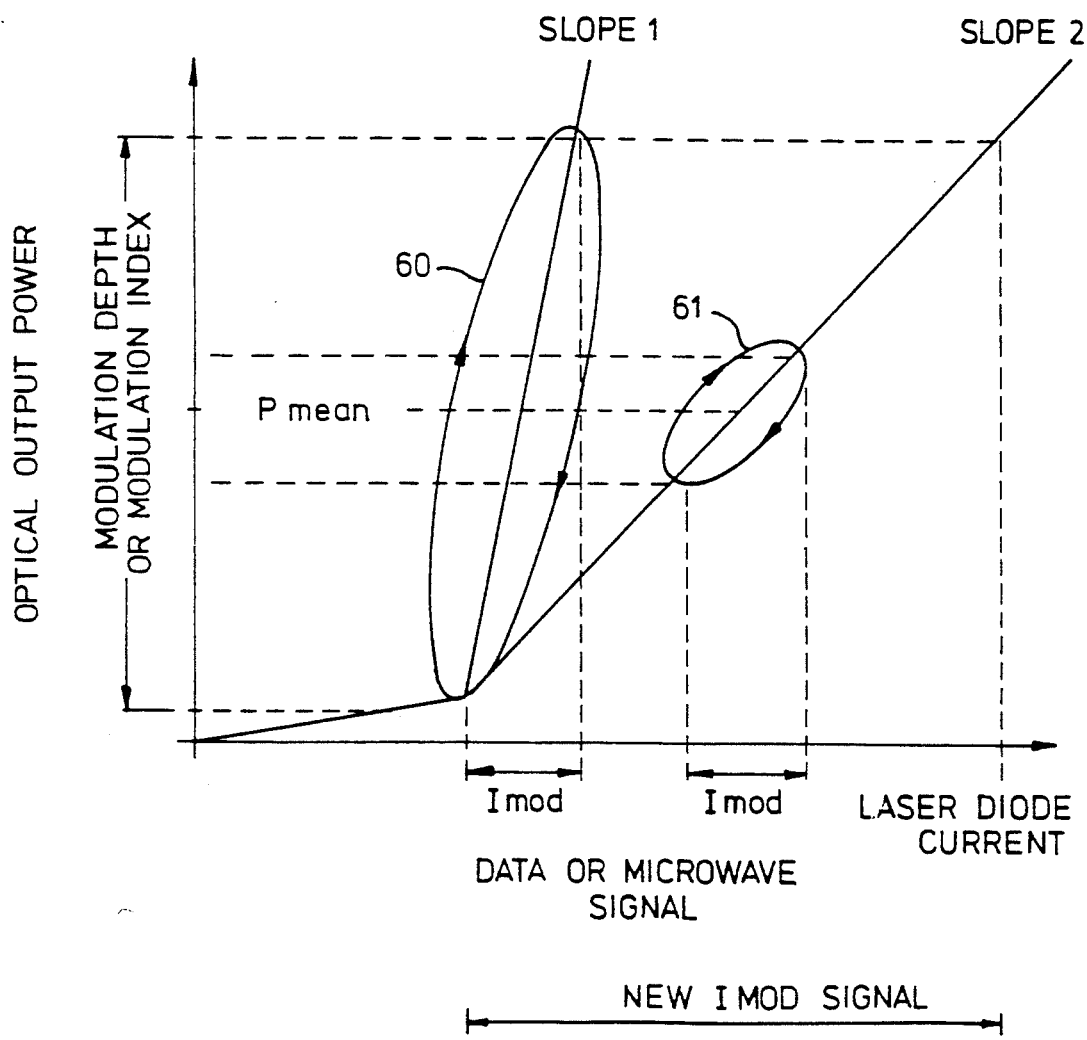
FIG. 4 illustrates variation of modulation depth or index of a digital or microwave signal due to slope variation of a laser diode.

Since the fibre coupler 30 is within the a.c. and d.c. control loops (loops 2 and 1 respectively) and the microwave modulation index (modulation depth) and mean power are set at room temperature initially, the loops will compensate for the temperature variations of the fibre coupler, provided that the transmitted power variation tracks the power variation presented to the feedback loops. FIG. 4 is an alternative way to FIG. 2 of showing the effect of slope variation. FIG. 4 shows the variation of modulation depth or index of a digital or microwave signal due to slope variation of the laser diode (between slopes 1 and 2). The ellipses 60 and 61 represent the a.c. optical signal. Under the operating conditions of slope 1, the optimum extinction ratio is set. If the slope changes to slope 2 and the optical transmitter only has a mean power control loop, the mean power will be held constant. Thus with Imod fixed, the a.c. optical signal must reduce to 61 from 60 as shown. To maintain constant (optimum) extinction ratio under such conditions Imod must change to New Imod as shown. It should be noted that FIG. 3 shows a single ended design since the photodiode would be external from the laser package in a microwave subcarrier application.

As will be appreciated from the above, the inventive arrangements do not employ peak detection rather the a.c. information signal is rectified in order to gain an indication of the average "rectified" a.c. power, which in turn is used to indicate a reduction in slope efficiency. This rectification can be achieved, without the use of diodes as employed in a conventional peak detection arrangement, such as by using a modified long tail pair (not shown) or a similar arrangement. In the conventional peak detection arrangement there is the problem of diode voltage drop giving errors in extinction ratio, which are greatest at low signal levels.

The above arrangements are particularly useful in applications where the laser diodes are not cooled and thus where slope control is of importance. They may, however, also be used where the laser diodes are cooled, and the slope efficiency is therefore reasonably constant, in order to compensate for variations due to time (ageing of the laser diodes).

I claim:

1. An optical transmitter including a laser diode and achieving automatic slope variation compensation of the laser diode, the transmitter further including a photodetector disposed to detect the output optical signal of the laser diode, a first control loop and a second control loop, the first control loop serving to maintain the mean optical signal power output from the laser diode at a first predetermined level by adjustment of bias current applied thereto, in response to comparison of a voltage signal representing mean optical signal power obtained from the photodetector a.c. output signal with a voltage corresponding to the first predetermined level, and the second control loop serving to adjust modulation current applied to the laser diode whereby to maintain the a.c. optical signal power output from the laser diode at a second predetermined level, which modulation current adjustment is carried out in response to the detection of an error signal between the second predetermined level and a mean value of the a.c. optical signal power obtained in the second control loop from the photodetector a.c. output signal by successive amplification and rectification.

2. An optical transmitter as claimed in claim 1, wherein the first control loop further includes a high gain transconductance amplifier to which any error signal resulting from the comparison carried out in the first control loop is applied and the output of which comprises the bias current.

3. An optical transmitter as claimed in claim 2 wherein the output of the transconductance amplifier is applied to the laser diode via a post filtering circuit.

4. An optical transmitter as claimed in claim 1, wherein second loop includes a differentially - configured transimpedence amplifier, to which the a.c. output signal from the photodetector is applied, followed by an a.c. to d.c. converter, which amplifier and converter achieve said amplification and rectification.

5. An optical transmitter as claimed in claim 4 wherein the voltage signal representing mean optical power and employed in the first control loop is obtained from a terminating resistor of the transimpedence amplifier.

6. An optical transmitter as claimed in claim 4 wherein any error signal resulting from the comparison carried out in the second control loop is applied to a respective high gain transconductance amplifier and a modulation signal is applied to the output thereof, the resultant signal comprising said modulation current.

7. An optical transmitter as claimed in claim 1 wherein the output of the laser diode is applied to an input of an optical fibre coupler, a proportion of the output signal is taken from an output of the coupler and applied to the photodetector and the remainder is output for transmission from another output.

8. An optical transmitter as claimed in claim 7 and comprising an optical microwave subcarrier communications transmitter, the photodetector comprising a very high frequency PIN photodiode.

* * * * *